United States Patent
Mori et al.

(10) Patent No.: US 8,525,017 B2
(45) Date of Patent: Sep. 3, 2013

(54) SEALING MATERIAL FOR SOLAR BATTERY, SHEET FOR SEALING SOLAR BATTERY, AND SOLAR BATTERY MODULE USING THE SAME

(75) Inventors: Ryoji Mori, Ichihara (JP); Takashi Nakagawa, Ichihara (JP); Hiromasa Marubayashi, Chigasaki (JP)

(73) Assignee: Mitsui Chemicals, Inc., Tokyo (JP)

( * ) Notice: Subject to any disclaimer, the term of this patent is extended or adjusted under 35 U.S.C. 154(b) by 249 days.

(21) Appl. No.: 12/085,511

(22) PCT Filed: Nov. 24, 2006

(86) PCT No.: PCT/JP2006/323394
§ 371 (c)(1),
(2), (4) Date: May 23, 2008

(87) PCT Pub. No.: WO2007/061030
PCT Pub. Date: May 31, 2007

(65) Prior Publication Data
US 2009/0165847 A1    Jul. 2, 2009

(30) Foreign Application Priority Data

Nov. 25, 2005 (JP) ................................ 2005-340362

(51) Int. Cl.
*H01L 31/042* (2006.01)
*H01L 31/00* (2006.01)

(52) U.S. Cl.
USPC ......................................... 136/251; 136/256

(58) Field of Classification Search
USPC ........................... 136/256, 251; 525/192, 240
See application file for complete search history.

(56) References Cited

U.S. PATENT DOCUMENTS

| | | | |
|---|---|---|---|
| 4,860,509 A * | 8/1989 | Laaly et al. ................ | 52/173.3 |
| 5,001,205 A * | 3/1991 | Hoel .............................. | 526/128 |
| 5,115,030 A * | 5/1992 | Tanaka et al. ................ | 525/240 |
| 5,206,075 A * | 4/1993 | Hodgson, Jr. ................ | 428/216 |
| 5,316,843 A * | 5/1994 | Kiryu et al. .................... | 428/323 |
| 5,451,639 A * | 9/1995 | Marczinke et al. ........... | 525/193 |
| 5,910,539 A | 6/1999 | Matsunaga et al. | |
| 6,207,754 B1 * | 3/2001 | Yu ................................. | 525/133 |
| 6,335,479 B1 * | 1/2002 | Yamada et al. ............... | 136/251 |
| 6,750,284 B1 * | 6/2004 | Dharmarajan et al. ....... | 524/515 |
| 2002/0038664 A1 * | 4/2002 | Zenko et al. .................. | 136/251 |
| 2007/0009753 A1 * | 1/2007 | Sato .............................. | 428/523 |

FOREIGN PATENT DOCUMENTS

| | | |
|---|---|---|
| CN | 1165532 | 11/1997 |
| JP | 61-152753 | 7/1986 |
| JP | 08-283696 | 10/1996 |
| JP | 2000-091611 | 3/2000 |
| JP | 2003-298092 | 10/2003 |
| JP | 2005-307112 | 11/2005 |
| WO | WO-2004/104088 | 12/2004 |

OTHER PUBLICATIONS

Inoue et al., JP 2005-307112—English machine translation.*
Office Action in CN Appln No. 2006800439892.7 dated Nov. 30, 2010.

* cited by examiner

*Primary Examiner* — Jonathan Johnson
*Assistant Examiner* — Tamir Ayad
(74) *Attorney, Agent, or Firm* — Foley & Lardner LLP

(57) ABSTRACT

[Task] To provide a solar battery sealing material obtained by using an olefin-based (co)polymer, which is excellent in flexibility, stress-absorbing property, transparency, and impact-resistant strength at low temperature, and with which the productivity is improved by omitting a cross-linking treatment if necessary.
[Solving Means] A solar battery sealing material containing 1 to 40 parts by weight of polypropylene (i) which has a propylene unit of more than 90 mol %; and 60 to 99 parts by weight of a propylene.ethylene-based copolymer (ii) which has a propylene unit of 45 to 90 mol %, an ethylene unit of 10 to 25 mol %, and an α-olefin unit (a) having 4 to 20 carbon atoms of 0 to 30 mol % ((i)+(ii)=100 parts by weight). The solar battery sealing material further contains 5 to 95 parts by weight of an ethylene.α-olefin copolymer (B), based on 95 to 5 parts by weight of the total amount of (i) and (ii) ((i)+(ii)+(B)=100 parts by weight).

8 Claims, No Drawings

SEALING MATERIAL FOR SOLAR BATTERY, SHEET FOR SEALING SOLAR BATTERY, AND SOLAR BATTERY MODULE USING THE SAME

TECHNICAL FIELD

The present invention relates to a sealing material for a solar battery which is useful for shielding a solar battery element from ambient air, more specifically relates to a sealing material for a solar battery which is excellent in flexibility, stress absorbing property, transparency, and impact-resistant strength at low temperature.

The present invention is preferably used in a sheet for sealing a solar battery employing the solar battery sealing material, and in a solar battery module employing the sealing material and/or the sealing sheet.

BACKGROUND ART

While problems in global environment and energy are becoming serious, a solar battery has attracted attention as an energy source of clean and causing no depletion. When using the solar battery outside such as on the part of a building roof, it is general to be used in the form of a solar battery module.

In general, the solar battery module has a constitution in which a solar battery cell formed from multicrystalline silicon or the like is superposed and laminated between solar battery sealing materials formed from a soft and transparent resin, and both the front-back surfaces of the laminate is covered with a protective sheet for a solar battery module. That is, a typical solar battery module has a lamination configuration of a protective sheet for solar battery module (front surface protecting sheet)/a sheet for sealing a solar battery/a solar battery cell/a sheet for sealing a solar battery/a protective sheet for solar battery module (back surface protecting sheet). As a result, the solar battery module has a weather resistant property, and is suitable for the outside use such as the use at the roof of a building and the like.

In the past, an ethylene.vinyl acetate copolymer (EVA) has been widely used as a material forming the sheet for sealing a solar battery (sealing material for solar battery) because of its transparency, flexibility, and the like (for example, see Patent Document 1). When the ethylene.vinyl acetate copolymer is used as a solar battery sealing material, it is general to perform a cross-linking treatment to give sufficient heat resistance. However, the cross-linking treatment requires a comparatively long period of time of about 1 to 2 hours, which thus has become the cause of lowering a production rate and production efficiency of a solar battery module. In addition, it has been concerned that a component of acetic acid gas or the like, which is generated when EVA is decomposed, may possibly have an impact on a solar battery element.

As one of the means for solving aforementioned technical problems, there can be mentioned a use of an olefin-based (co)polymer as at least one part of a solar battery sealing material, and also there is a proposal about a solar battery sealing material having an olefin-based (co)polymer (see Patent Document 2). However, the Patent Document 2 is not disclosing any specific guidelines for kinds of the olefin-based (co)polymer and embodiment of usage, for obtaining desired properties (flexibility, stress absorbing property, transparency, impact resistant strength at low temperature, etc.) as a sealing material. It can be thought that the technology disclosed in the Patent Document 2 is based on an assumption that there is a cross-linking treatment, and is to achieve the desired properties in conjunction with the cross-linking treatment.

Patent Document 1: Japanese Patent Unexamined Publication No. H8-283696
Patent Document 2: Japanese Patent Unexamined Publication No. 2000-091611

DISCLOSURE OF THE INVENTION

Problems to be Solved in the Invention

The present invention is contrived considering the aforementioned background, and is aimed to clarify the guidelines for obtaining desired properties (not necessarily accompanying the cross-linking treatment) for a solar battery sealing material having an olefin-based (co)polymer, and to provide a solar battery sealing material excellent in flexibility, stress absorbing property, transparency, and impact-resistant strength at low temperature and with which neck-in can be reduced and if necessary, productivity can be improved by omitting a cross-linking treatment.

Means for Solving the Problems

The present inventors have made extensive studies and found that it is possible to obtain a solar battery sealing material excellent in flexibility, stress absorbing property, transparency, and impact-resistant strength at low temperature, which can improve productivity by omitting the cross-linking treatment if necessary, by using a specific polypropylene, a specific propylene.ethylene-based copolymer, and a specific ethylene.$\alpha$-olefin copolymer in combination in a specific weight ratio. Thus, they have completed the invention.

That is, the present invention relates to the followings:

(1) A solar battery sealing material containing 0 to 90 parts by weight of a propylene-based polymer ($\alpha$), which has a melting point of 100° C. or more, when measured by a differential scanning calorimeter (DSC); and 10 to 100 parts by weight of a propylene-based copolymer ($\beta$), which is a copolymer of propylene with at least one olefin selected from the group consisting of ethylene and $\alpha$-olefins having 4 to 20 carbon atoms, and has a Shore A hardness of 30 to 80 and a melting point of less than 100° C. or no melting point, when measured by the differential scanning calorimeter (total amount of ($\alpha$) and ($\beta$) is 100 parts by weight), in which the solar battery sealing material further contains an ethylene.$\alpha$-olefin copolymer (B) within the amount of 5 to 95 parts by weight, based on 95 to 5 parts by weight of the total amount of ($\alpha$) and ($\beta$) (total amount of ($\alpha$), ($\beta$), and (B) is 100 parts by weight).

(2) A solar battery sealing material containing 1 to 40 parts by weight of polypropylene (i) which has the content of a structural unit derived from propylene of more than 90 mol %; and 60 to 99 parts by weight of a propylene.ethylene-based copolymer (ii) which has a structural unit derived from propylene of 45 to 90 mol %, a structural unit derived from ethylene of 10 to 25 mol %, and a structural unit derived from $\alpha$-olefin having 4 to 20 carbon atoms of 0 to 30 mol % (total amount of (i) and (ii) is 100 parts by weight), wherein the solar battery sealing material further contains an ethylene.$\alpha$-olefin copolymer (B) within the amount of 5 to 95 parts by weight and 95 to 5 parts by weight of the total amount of (i) and (ii) (total amount of (i), (ii), and (B) is 100 parts by weight).

Hereinafter, the items (3) to (11) are each a preferred example of the invention.

(3) The solar battery sealing material described in the above item (2), wherein the propylene.ethylene copolymer (ii) has no melting point Tm (° C.) on an endothermic curve measured by a differential scanning calorimeter (DSC), or the propylene.ethylene copolymer (ii) has a Tm and a heat of fusion ΔH of 30 J/g or less and satisfies the relation of $$\Delta H(J/g) < 345 \times Ln \text{ (propylene content (mol \%))} - 1492$$

when the propylene content is within a range of 76≦propylene content (mol %)≦90.

(4) The solar battery sealing material described in the above item (2), in which the propylene.ethylene copolymer (ii) has a structural unit derived from 1-butene and/or a structural unit derived from 1-octene as a structural unit derived from α-olefin having 4 to 20 carbon atoms (a).

(5) The solar battery sealing material according to any one of the items (1) to (4), in which the ethylene.α-olefin copolymer (B) has a structural unit derived from ethylene of 80 to 90 mol %.

(6) The solar battery sealing material according to any one of the items (1) to (4), in which the ethylene.α-olefin copolymer (B) has a density of 0.86 to 0.89 g/cm$^3$.

(7) The solar battery sealing material according to any one of (1) to (6), further containing a silane coupling agent (C).

(8) The solar battery sealing material according to any one of the items (2) to (7), further containing a petroleum resin (D1), a terpene resin (D2) and/or hydrogenated derivatives thereof (D3); or the hydrogenated derivatives thereof (D3) with the total amount of 1 to 30 parts by weight, based on 100 parts by weight of the total amount of the polypropylene (i), propylene.ethylene-based copolymer (ii), and ethylene.α-olefin copolymer (B).

(9) A sheet for sealing solar battery obtained by using the solar battery sealing material of any one of the items (1) to (8).

(10) A solar battery module obtained by using the solar battery sealing material of any one of the above items (1) to (8) and/or the sheet for sealing solar battery described in the item (9).

(11) A power generation unit obtained by using the solar battery module described in the item (10).

Further, the invention relates to the following;

(12) A polymer composition containing 0 to 90 parts by weight of a propylene-based polymer (α) which has a melting point of 100° C. or more when measured by a differential scanning calorimeter (DSC); and 10 to 100 parts by weight of a propylene-based copolymer (β) which is a copolymer of propylene with at least one olefin selected from the group consisting of ethylene and α-olefins having 4 to 20 carbon atoms, and has a Shore A hardness of 30 to 80 and a melting point of less than 100° C. or no melting point when measured by the differential scanning calorimeter (DSC) (total amount of (α) and (β) is 100 parts by weight), wherein the polymer composition further contains an ethylene.α-olefin copolymer (B) with the amount of 5 to 95 parts by weight, and 95 to 5 parts by weight of the total amount of (α) and (β) (total amount of (α), (β), and (B) is 100 parts by weight).

Further, the invention relates to the following;

(13) A polymer composition containing 1 to 40 parts by weight of polypropylene (i) which has the content of a structural unit derived from propylene of more than 90 mol %; and 60 to 99 parts by weight of a propylene.ethylene-based copolymer (ii) which has a structural unit derived from propylene of 45 to 90 mol %, a structural unit derived from ethylene of 10 to 25 mol %, and a structural unit derived from α-olefin having 4 to 20 carbon atoms of 0 to 30 mol % (total amount of (i) and (ii) is 100 parts by weight), in which the polymer composition further contains an ethylene.α-olefin copolymer (B) within the amount of 5 to 95 parts by weight and 95 to 5 parts by weight of the total amount of (i) and (ii) (total amount of (i), (ii), and (B) is 100 parts by weight).

Hereinafter, items (14) to (16) each are a preferred embodiment of the invention.

(14) The polymer composition according to the items (12) or 13 further containing a silane coupling agent.

(15) The polymer composition according to any one of the items (12) to (14) further containing a radical initiator.

(16) The polymer composition according to any one of the items (12) to (15) further containing a petroleum resin (D1), a terpene resin (D2), and/or hydrogenated derivatives thereof (D3).

Advantage of the Invention

According to the invention, there is provided a solar battery sealing material which is excellent in flexibility, heat resistance property, stress absorbing property, transparency and impact-resistant strength at low temperature and is capable of reducing the neck-in. The solar battery sealing material can improve the productivity by omitting crosslinking treatment if necessary, and provide an excellent economical efficiency in addition to excellent properties described above.

DETAILED DESCRIPTION OF THE PREFERRED EMBODIMENTS

Hereinafter, the present invention will be described in detail.

The invention is a solar battery sealing material containing 1 to 40 parts by weight, preferably 1 to 30 parts by weight of polypropylene (i) which has the content of a structural unit derived from propylene of more than 90 mol %; and 60 to 99 parts by weight, preferably 70 to 99 parts by weight of a propylene.ethylene-based copolymer (ii) which has a structural unit derived from propylene of 45 to 90 mol %, a structural unit derived from ethylene of 10 to 25 mol %, and a structural unit (a) derived from α-olefin having 4 to 20 carbon atoms of 0 to 30 mol % (total amount of (i) and (ii) is 100 parts by weight), wherein the solar battery sealing material further contains an ethylene.α-olefin copolymer (B) with the amount of 5 to 95 parts by weight, and 95 to 5 parts by weight of the total amount of (i) and (ii), and preferably contains the ethylene.α-olefin copolymer (B) with the amount of 5 to 40 parts by weight, and 95 to 60 parts by weight of the total amount of (i) and (ii) (total amount of (i), (ii), and (B) is 100 parts by weight).

First of all, polypropylene (i) and propylene.ethylene copolymer (ii) will be explained.

Polypropylene (i)

The polypropylene (i), which is a component constituting the solar battery sealing material of the invention, is a propylene (co)polymer in which the content of a structural unit derived from propylene is more than 90 mol %.

The polypropylene (i) used in the invention may be either homopolypropylene, a propylene.α-olefin random copolymer or a propylene.α-olefin block copolymer, as long as it satisfies the conditions mentioned above, but the homopolypropylene or the propylene.α-olefin random copolymer is preferably used.

For the polypropylene (i) used in the invention, it is desirable that the isotactic pentad fraction is 0.94 or more, and preferably 0.95 or more as measured by the NMR technique.

The isotactic pentad fraction (mmmm) represents the fraction for the presence of an isotactic sequence in a pentad unit in the molecular chain, which is measured by $^{13}$C-NMR, and is a fraction of the propylene monomer unit located at the center of a sequence in which five propylene monomer units are sequentially meso-bonded. Specifically, it is a value calculated as the fraction of the mmmm peak among the entire absorption peaks in the methyl carbon region observed in the $^{13}$C-NMR spectrum.

The isotactic pentad fraction (mmmm) is generally measured in the following manner.

The mmmm fraction is determined from Pmmmm (the absorption intensity originating from the methyl group in the third unit at a site where five propylene units are sequentially isotactically bonded) and PW (the absorption intensity originating from the entire methyl groups in the propylene units) in a $^{13}$C-NMR spectrum according to the following expression.

mmmm fraction=Pmmmm/PW

The NMR measurement is performed, for example, in the following manner. That is, 0.35 g of a sample is dissolved under heating in 2.0 ml of hexachlorobutadiene. Filtered through a glass filter (G2), the solution was introduced into an NMR tube having an internal diameter of 10 mm after adding 0.5 ml of deuterated benzene. Then, $^{13}$C-NMR measurement is performed at 120° C. using a GX-500 NMR measuring apparatus manufactured by JEOL, Ltd with 10,000 times or more of integration.

The melt flow rate (MFR; ASTM D1238, 230° C., under a load of 2.16 kg) of the polypropylene (i) used in the invention is usually 0.01 to 400 g/10 min, and preferably 0.5 to 90 g/10 min. The melting point obtained from a DSC measurement is generally 120° C. or above, preferably 130° C. or above, and further preferably 150° C. or above.

With the polypropylene (i) having such MFR value, a propylene polymer composition having fluidity in an appropriate range and preferable for a use as a solar battery sealing material can be obtained. In addition, since the MFR value is 400 g/10 min or less, a sufficient impact resistance (IZ impact strength) can be achieved.

When the polypropylene (i) is a propylene.α-olefin random copolymer, it is preferable that the α-olefin is selected from a group comprising ethylene and α-olefin having 4 to 20 carbon atoms. In addition, it is preferable that the α-olefin is contained in an amount from 0.3 mol % or more to less than 10 mol %, preferably from 0.3 to 7 mol %, and more preferably from 0.3 to 5 mol %.

The amount of the n-decane soluble component at room temperature contained in the polypropylene (i) is generally 0.1 to 5% by weight, and preferably 0.1 to 3% by weight. When the amount of the n-decane soluble component at room temperature is in the above range, it is particularly preferable because an excellent heat resistance is exhibited. The amount of the n-decane soluble component at room temperature contained in polypropylene (i) can be determined by back calculating from the weight of a solid phase obtained by immersing 5 g of a sample of polypropylene (i) in 200 cc of boiling n-decane for 5 hours to dissolve the sample, cooling the solution to room temperature, filtering the precipitated solid phase through a G4 glass filter, and drying the obtained component to be measured.

The polypropylene (i) used in the invention can be produced according to various methods. For example, the polypropylene (i) may be produced using a stereoregular catalyst. Specifically, the polypropylene (i) may be produced using a catalyst formed from a solid titanium catalyst component and an organometallic compound catalyst component and, if necessary, an electron donor. The solid titanium catalyst component can be specifically exemplified by a solid titanium catalyst component formed by supporting titanium trichloride or a titanium trichloride composition on a carrier having a specific surface area of 100 m$^2$/g or more, or a solid titanium component formed by supporting essential components such as magnesium, halogen, electron donor (preferably aromatic carboxylic ester or alkyl group-containing ether) and titanium on a carrier having a specific surface area of 100 m$^2$/g or more. In addition, the polypropylene (i) may be prepared using a metallocene catalyst. Of these, preferred is the latter solid titanium catalyst component.

As for the organometallic compound catalyst component, an organoaluminum compound is preferable. Specific examples of the organoaluminum compound include trialkylaluminum, dialkylaluminum halide, alkylaluminum sesquihalide, alkylaluminum dihalide, and the like. The organoaluminum compound to be used may be suitably selected depending on the kinds of the titanium catalyst component used.

Examples of the electron donor include organic compounds having a nitrogen atom, a phosphorus atom, a sulfur atom, a silicon atom, or a boron atom, and preferably include an ester compound and an ether compound having the atom as mentioned above.

Such catalyst may further be activated by means of the copulverization technique or the like, or may be prepolymerized with olefins as mentioned above.

Propylene.Ethylene-Based Copolymer (ii)

The propylene.ethylene-based copolymer (ii) contains structural units derived from propylene in an amount of 45 to 90 mol %, preferably 45 to 80 mol %, and more preferably 50 to 75 mol %, structural units derived from ethylene in an amount of 10 to 25 mol %, preferably 10 to 23 mol %, and more preferably 12 to 23 mol % and structural units (a) derived from α-olefin having 4 to 20 carbon atoms in an amount of 0 to 30 mol %, preferably 0 to 25 mol %, and more preferably 0 to 20 mol %.

The propylene.ethylene-based copolymer (ii) containing a propylene component, an ethylene component and an α-olefin component having 4 to 20 carbon atoms as an arbitrary component in the amounts mentioned above is excellent in compatibility with the polypropylene (i) having propylene content of greater than 90 mol %. Therefore, the propylene-based polymer composition thus obtained tends to exhibit an excellent transparency, flexibility, heat resistance, and scratch resistance.

There is no specific limitation for the α-olefin having 4 to 20 carbon atoms which is an arbitrary component, and the α-olefin having 4 to 20 carbon atoms which is copolymerizable with propylene and ethylene can be suitably used. Among these, preferred ones are α-olefins having 4 to 8 carbon atoms. Examples of such α-olefin include 1-butene, 1-pentene, 1-hexene, 3-methyl-1-butene, 3,3-dimethyl-1-butene, 4-methyl-1-pentene, 1-octene, and the like. Among these, 1-butene, 1-pentene, 1-hexene, 4-methyl-1-pentene, and 1-octene are preferable in view of high availability, and 1-butene and 1-octene are particularly preferable in view of flexibility and transparency of the copolymer obtained. The α-olefin having 4 to 20 carbon atoms may be used alone or in combination of two or more kinds.

The intrinsic viscosity [η] of the propylene.ethylene-based copolymer (ii) as measured in decalin at 135° C. is desirably within the range of usually from 0.01 to 10 dl/g and preferably 0.05 to 10 dl/g. When intrinsic viscosity [η] of the propylene.ethylene-based copolymer (ii) is in the above range, a propylene.ethylene-based copolymer having excellent properties such as weather resistance, ozone resistance, heat aging resistance, a low temperature characteristic, and resistance to dynamic fatigue can be easily obtained.

The stress (m100) of the propylene.ethylene-based copolymer (ii) at 100% of strain is 4 MPa or less, preferably 3 MPa or less and more preferably 2 MPa or less as measured according to JIS K6301 using a dumbbell of JIS3 type with a span of 30 mm at a stress rate of 30 mm/min at 23° C. When the stress of propylene.ethylene-based copolymer (ii) is within such a range, the propylene.ethylene-based copolymer (ii) shows excellent flexibility, transparency, and rubber elasticity.

The crystallinity of the propylene.ethylene-based copolymer (ii) as measured by X-ray diffractometer usually shows 20% or less, and preferably 0 to 15%. In addition, the propylene.ethylene-based copolymer (ii) has only one glass transition temperature, and the glass transition temperature Tg as measured with DSC is usually −10° C. or below, and preferably −15° C. or below. When the glass transition temperature Tg of the propylene.ethylene-based copolymer (ii) is in the above range, propylene.ethylene-based copolymer (ii) shows excellent cold resistance and a low temperature characteristic.

The melting point Tm (° C.) of the propylene.ethylene-based copolymer (ii) may not be observed from an endothermic curve obtained by differential scanning calorimetry (DSC), and when there is observed a melting point, it is preferable that the propylene.ethylene-based copolymer (ii) has the heat of fusion ΔH (J/g) of 30 (J/g) or less.

In addition, when the propylene.ethylene-based copolymer (ii) has the melting point and the propylene content is within the range of the following:

76≤propylene content (mol %)≤90, it is preferable that the propylene content (mol %) and the heat of fusion ΔH(J/g) satisfy the following relational expression:

ΔH(J/g)<345×Ln (propylene content (mol %))−1492.

When the propylene.ethylene-based copolymer (ii) satisfies the above relation, the compatibility with polypropylene (i) and flexibility are improved. Accordingly, whitening or breakage of a silicon cell after a thermal treatment can be efficiently prevented, thus it is preferable.

The propylene.ethylene-based copolymer (ii) having the propylene content (mol %) and the heat of fusion ΔH(J/g) that are satisfying the above relations can be suitably obtained by suppressing the crystallization of the copolymer under appropriate polymerization conditions. For example, by suitably selecting the catalyst, the crystallinity can be lowered, thereby decreasing the heat of fusion ΔH with the same content of the propylene. Accordingly, the propylene.ethylene-based copolymer (ii) having the propylene content (mol %) and the heat of fusion ΔH(J/g) which are satisfying the above relations can be obtained. A preferred catalyst for reducing the crystallinity is mentioned in Example.

In addition, by suitably setting a polymerization temperature and a polymerization pressure, the crystallinity of the propylene.ethylene-based copolymer (ii) can be controlled. For example, the crystallinity of the copolymer to be obtained can be reduced by elevating the polymerization temperature. Also, the crystallinity of the copolymer to be obtained also can be reduced by lowering the polymerization pressure. As a result, the heat of fusion ΔH of the propylene.ethylene-based copolymer (ii) is lowered with the same propylene content, and thereby the propylene.ethylene-based copolymer (ii) having the propylene content (mol %) and the melting endothermic amount ΔH(J/g) which are satisfying the above relations can be obtained.

Here, the phrase "melting point may not be observed" in the present specification means that there is no observed peak of crystalline melting with heat of crystalline melting of 1 J/g or more within the range of −150 to 200° C. The measurement conditions are as described in Example.

It is preferable that the molecular weight distribution (Mw/Mn, in terms of polystyrene, Mw: weight average molecular weight, Mn: number average molecular weight) of the propylene.ethylene-based copolymer (ii) is 4.0 or less, preferably 3.0 or less and more preferably 2.5 or less.

The triad tacticity (mm fraction) of the propylene.ethylene-based copolymer (ii) as measured by $^{13}$C-NMR is usually 85% or more, preferably 85 to 97.5%, more preferably 87 to 97% and further preferably 90 to 97%. When the triad tacticity (mm fraction) is in the above range, a balance between the flexibility and the mechanical strength is particularly excellent, thus it is suitable for the invention. The mm fraction can be measured according to a method described from line 7 on page 21 to line 6 on page 26 in WO 2004/087775.

The propylene.ethylene-based copolymer (ii) may be partially graft-modified using a polar monomer. Examples of the polar monomer include hydroxyl group-containing ethylenic unsaturated compounds, amino group-containing ethylenic unsaturated compounds, epoxy group-containing ethylenic unsaturated compounds, aromatic vinyl compounds, unsaturated carboxylic acids or derivatives thereof, vinyl ester compounds, vinyl chloride, and the like.

The modified propylene.ethylene-based copolymer can be obtained by graft-polymerizing a polar monomer to the propylene.ethylene-based copolymer (ii). When graft-polymerizing the polar monomer to the propylene.ethylene-based copolymer (ii), the polar monomer is used in the amount of usually from 1 to 100' parts by weight, and preferably from 5 to 80 parts by weight, based on 100 parts by weight of the propylene.ethylene-based copolymer (ii). The graft-polymerization is normally carried out in the presence of a radical initiator.

As the radical initiator, organic peroxides or azo compounds and the like can be used. The radical initiator may be used by directly mixed with the propylene.ethylene-based copolymer (ii) and the polar monomer, or may be used after dissolved in a small amount of an organic solvent. There is no specific limitation on the organic solvent used herein, and any organic solvents may be used as far as they can dissolve the radical initiator.

In addition, when graft polymerizing the polar monomer to the propylene.ethylene-based copolymer (ii), a reducing material may be used. Using the reducing material can increase the graft amount of the polar monomer.

The graft modification of the propylene.ethylene-based copolymer (ii) using the polar monomer can be carried out according to a conventionally known method. For example, the modification can be carried out in the manner of dissolving the propylene.ethylene-based copolymer (ii) into an organic solvent, subsequently adding the polar monomer and a radical initiator and the like to the solution, and then carrying out the reaction at a temperature of 70 to 200° C., preferably 80 to 190° C., for a period of 0.5 to 15 hours, preferably 1 to 10 hours.

The modified propylene.ethylene-based copolymer (ii) may also be prepared by reacting the propylene.ethylene-based copolymer (ii) to react with the polar monomer using an extruder or the like under solvent-free condition. In this case, the reaction temperature is generally not lower than the melting point of the propylene.ethylene-based copolymer (ii), specifically, in the range of 120 to 250° C., and the reaction time is generally in the range of 0.5 to 10 minutes.

The modified amount (graft amount of the polar monomer) of the modified propylene.ethylene-based copolymer (ii) thus obtained is usually within the range of usually 0.1 to 50% by weight, preferably 0.2 to 30% by weight, and more preferably 0.2 to 10% by weight.

When the modified propylene.ethylene-based copolymer described above is contained in the propylene-based polymer composition of the invention, the resulting composition may show excellent adhesion strength and compatibility with other resins, and show improved wet property of the surface of the molded product obtained from the propylene-based polymer composition.

Preparation of Propylene.Ethylene-Based Copolymer (ii)

The propylene.ethylene-based copolymer (ii) according to the invention may be prepared in the same manner using the catalyst same as the metallocene catalyst used for preparing the polypropylene (i). In addition, other various metallocene catalysts, various Ti catalysts, and various V catalysts may be employed for the preparation, but catalyst is not limited to those.

The preparation of the propylene.ethylene-based copolymer (ii) with the use of the same catalyst as the metallocene catalyst for preparing the polypropylene (i) is convenient when the propylene-based polymer composition (A) described below is prepared by a single-stage polymerization or a multi-stage polymerization method.

Propylene-Based Polymer Composition (A)

When preparing the solar battery sealing material of the invention, the polypropylene (i), the propylene.ethylene-based copolymer (ii), and the ethylene.α-olefin copolymer (B) may be blended in any order. One of the preferred methods of the preparation of the solar battery sealing material according to the invention includes processes of first preparing the composition (hereinafter, referred to as "propylene-based polymer composition (A)") of the polypropylene (i) and the propylene.ethylene-based copolymer (ii) because of relatively high compatibility of the polypropylene (i) and the propylene.ethylene-based copolymer (ii), and then blending the obtained propylene-based polymer composition (A) with the ethylene.α-olefin copolymer (B).

Hereinafter, the propylene-based polymer composition (A) will be described below.

It is preferable that the propylene-based composition (A) of the invention satisfies at least one of following conditions (I) to (IV). The propylene-based composition (A) satisfying all the conditions of (I) to (IV) is particularly preferable.

(I) From the dynamic viscoelasticity measurement (10 rad/s) in a torsion mode, a loss tangent (tan δ) peak is observed within the range of −25 to 25° C., and its peak value is 0.5 or more, (II) A ratio (G'(20° C.)/G'(100° C.)) of a storage elastic modulus G' (20° C.) and G' (100° C.) obtained by the dynamic viscoelasticity measurement is 5 or less, (III) A needle penetration temperature (° C.) measured in accordance with JIS K7196 is from 100 to 168° C., (IV), when 100% strain is applied to the sample with a chuck span of 30 mm and a tensile test speed of 30 mm/min, and is subjected to unloading for another 10 minutes after keeping the strain for 10 minutes, the residual strain is 20% or less.

In the condition (I), the loss tangent (tan δ) value at the temperature within the range of −25 to 25° C. is 0.5 or more, preferably 0.5 to 2.5, and more preferably 0.6 to 2. When the loss tangent (tan δ) value at the temperature within the range of −25 to 25° C. is 0.5 or more, an excellent scratch resistance as well as the sufficient flexibility is exhibited.

In the condition (II), the ratio (G'(20° C.)/G'(100° C.)) of the storage elastic moduli G'(20° C.) and G'(100° C.) is 5 or less, preferably 4 or less, and more preferably 3.5 or less.

When the ratio (G'(20° C.)/G'(100° C.)) of the storage elastic moduli G'(20° C.) and G'(100° C.) is 5 or less, a stickiness of the surface and deterioration in handling are prevented so that a sufficient heat resistance is readily exhibited.

In the condition (III), the needle penetration temperature (° C.) measured in accordance with JIS K7196 is desirably within the range of 100 to 168° C., preferably 120 to 168° C., and more preferably 140 to 168° C. When the needle penetration temperature (° C.) is more than 100° C., it contributes to improve the heat resistance of the solar battery sealing material, thus is preferable.

In the condition (IV), when a dumbbell-shaped specimen having a length of 50 mm, a width of 5 mm and a thickness of 1 mm is subjected to 100% strain with the chuck span of 30 mm and a tensile test speed of 30 mm/min, and is subjected to unloading for another 10 minutes after being kept for 10 minutes, it is preferable that the remained strain is 20% or less, preferably 18% or less, and more preferably 16% or less. The remaining straining of 20% or less tends to give excellent rubber elasticity, and is particularly advantageous for a case where a sufficient elastic recovery and impact resilience are required.

The propylene-based polymer composition (A) preferably employed in the invention has the melt flow rate (ASTM D 1238, 230° C., 2.16 kg load) of usually 0.0001 to 10 g/10 min, preferably 0.0001 to 900 g/10 min, and more preferably 0.0001 to 800 g/10 min and the intrinsic viscosity [η] measured in decahydronaphthalene at 135° C. of usually 0.01 to 10 dl/g, preferably 0.05 to 10 dl/g, and more preferably 0.1 to 10 dl/g.

The propylene-based polymer composition (A) preferably employed in the invention has the highest peak of the melting point Tm (° C.) at 100° C. or above on the endothermic curve measured by the differential scanning calorimeter (DSC). The heat of fusion is within the range of preferably 5 to 40 J/g, and more preferably 5 to 35 J/g.

The highest endothermic peak (melting point) of the propylene-based polymer composition (A) preferably employed in the invention is usually 130° C. or above, preferably 140° C. or above, and more preferably 160° C. or above.

The melt tension (MT) of the propylene-based polymer composition (A) preferably employed in the invention is usually from 0.5 to 10 g and preferably 1 to 10 g, thereby provides excellent moldability such as formability of films, tubes and the like. The melt tension (MT) is determined as a tensile force applied to a filament when a strand being extruded under the conditions of measuring temperature of 200° C. and an extrusion speed of 15 mm/min is taken up at a constant rate (10 m/min), using a melt tension tester (manufactured by Toyo Seiki Seisaku-Sho, Ltd.).

Preparation of Propylene-Based Polymer Composition (A)

The propylene-based polymer composition (A) preferably employed in the invention can be prepared by various known methods such as the single-stage polymerization, the multi-stage polymerization, and an in-line blending technique, with an aforementioned proportional range of each component of polypropylene (i) and propylene.ethylene-based copolymer (ii), etc. In addition, there can be employed a method of mixing with the use of a Henschel mixer, a V-blender, a ribbon blender, or a tumbler blender, or the like, or a method of mixing and then melt-kneading in a single screw extruder, a twin screw extruder, a kneader, a Banbury mixer, or the like, followed by pelletizing or grinding.

In the propylene-based polymer composition (A) preferably employed in the invention, if necessary, additives such as weathering stabilizer, heat resistant stabilizer, antistatic agent, antislipping agent, antiblocking agent, anti-fogging agent, lubricant, pigment, dye, plasticizer, anti-aging agent, hydrochloric acid absorbent, antioxidant and the like may be blended within the scope of not impairing the purpose of the invention. In addition, other copolymers (for example, propylene-butene copolymer resin, rubbers, elastomers and the like) besides the polypropylene (i), the propylene.ethylene-based copolymer (ii), and the ethylene.α-olefin copolymer (B) may be blended within the scope of not impairing the purpose of the invention.

The component besides the polypropylene (i) and the propylene.ethylene-based copolymer (ii) is not necessarily directly added to the propylene-based polymer composition (A), and may be added after mixing the propylene-based polymer composition (A) with the ethylene.α-olefin copolymer (B).

Ethylene.α-olefin Copolymer (B)

The α-olefin which is used as a starting material for the ethylene.α-olefin copolymer (B) used in the invention is not particularly limited, and any α-olefins can be suitably used as long as it is copolymerizable with ethylene. In general, α-olefins having 3 to 20 carbon atoms can be used alone or in combination of two or more kinds. Among these, α-olefins having 4 or more carbon atoms are preferable, and α-olefins having 4 to 8 carbon atoms are particularly preferable. Examples of such α-olefins include 1-butene, 1-pentene, 1-hexene, 3-methyl-1-butene, 3,3-dimethyl-1-butene, 4-methyl-1-pentene, 1-octene and the like. These α-olefins may be used alone or in combination of two or more kinds. Among these, 1-butene, 1-pentene, 1-hexene, 4-methyl-1-pentene and 1-octene are preferable, and 1-butene and 1-octene are particularly preferable in view of high availability.

The ethylene α-olefin copolymer (B) used in the invention may contain comonomer components other than ethylene and α-olefin within the scope of not impairing the purpose of the invention. Examples of the other polymerizable monomers include vinyl compounds such as styrene, vinylcyclopentyne, vinylcyclohexane, and vinylnorbornane; vinyl esters such as vinyl acetate; unsaturated organic acid such as maleic anhydride, or derivatives thereof; conjugated dienes such as butadiene, isoprene, pentadiene, and 2,3-dimethylbutadiene; non-conjugated polyenes such as 1,4-hexadiene, 1,6-octadiene, 2-methyl-1,5-hexadiene, 6-methyl-1,5-heptadiene, 7-methyl-1,6-octadiene, dicyclopentadiene, cyclohexadiene, dicyclooctadiene, methylene norbornene, 5-vinylnorbornene, 5-ethylidene-2-norbornene, 5-methylene-2-norbornene, 5-isopropylidene-2-norbornene, 6-chloromethyl-5-isopropenyl-2-norbornene, 2,3-diisopropylidene-5-norbornene, 2-ethylidene-3-isopropylidene-5-norbornene, and 2-propenyl-2,2-norbornadiene; and the like.

The ethylene content in the ethylene.α-olefin copolymer (B) used in the invention is not particularly limited as long as it is 40 mol % or more, but is preferably 50 mol % to 90 mol %, and particularly preferably within the range of 80 mol % to 90 mol %. When a structural unit derived from ethylene is 90 mol % or less, good compatibility between the polypropylene (i) and the propylene.ethylene-based copolymer (ii) which are used with the ethylene/α-olefin-based copolymer (B) is exhibited, and thus it is preferable in view of flexibility, transparency, etc. When the structural unit derived from ethylene is 50 mol % or more, a stickiness of the obtained resin composition is prevented so that high commercial value is obtained in practical. More specifically, when α-olefin having 4 or more carbon atoms is used, it is preferable that the structural unit derived from ethylene is 82 to 89 mol % and the structural unit derived from α-olefin having 4 or more carbon atoms is 18 to 11 mol % in total. When the content of α-olefin having 4 or more carbon atoms is within the above range, it is preferable in the view of a good balance between flexibility and low temperature characteristic, that is, particularly impact strength at low temperature.

There is no limitation on the density of the ethylene.α-olefin copolymer (B) used in the invention, but the density within the range of 0.86 to 0.89 g/cm$^3$ gives a preferable effect of exhibiting an excellent transparency. The density can be measured using a density gradient tube. The density is within the range of more preferably 0.87 to 0.89 g/cm$^3$, and particularly preferably 0.87 to 0.88 g/cm$^3$.

The molecular weight of the ethylene.α-olefin copolymer (B) used in the invention is not particularly limited, but the number average molecular weight measured by Gel Permeation Chromatography (GPC) is preferably from 5,000 to 1,000,000, and more preferably 10,000 to 600,000, in terms of polyethylene. When this number average molecular weight is within the range of 5,000 to 1,000,000, properties of the composition of the invention is effectively improved and at the same time, a problem of the stickiness of the surface is resolved.

The molecular weight distribution (Mw/Mn) of the ethylene.α-olefin copolymer (B) used in the invention is not particularly limited, but is preferably 3 or less. It is generally known that decrease in the molecular weight distribution gives a narrower composition distribution. Thus, it is expected as that the narrow composition distribution gives the improved compatibility between the ethylene.α-olefin copolymer (B) and the propylene-based copolymer composition (A). As an index of the composition distribution, a proportion of the average α-olefin content (mol %) in the low molecular weight fraction 10% to an average α-olefin content (mol %) in the high molecular weight fraction 10% as fractionated by GPC may be used. When their proportion is 1.2 or less, ethylene.α-olefin copolymer (B) preferably shows excellent transparency and mechanical strength.

The method of preparing the ethylene.α-olefin copolymer as described above is not particularly limited, and the ethylene.α-olefin copolymer (B) can be prepared by using various catalysts such as a titanium-based catalyst, a vanadium-based catalyst and a metallocene-based catalyst. Among these, it is preferable to use the metallocene-based catalyst from which the ethylene.α-olefin copolymer satisfying the molecular weight, the molecular weight distribution, and the composition distribution within above ranges is readily obtained.

Silane Coupling Agent (C)

The solar battery sealing material of the invention and the polymer composition constituting the same preferably further contain the silane coupling agent (C).

Generally the coupling agent is blended for the purpose of improving the adhesion to glasses, plastics, or the like. In the invention, the coupling agent can be used without particular restriction as long as it improves the adhesivity of the solar battery sealing material of the invention and the polymer composition constituting the same with other layers such as glass and polyester. The coupling agents such as silane-based coupling agent, titanate-based coupling agent, and chrome-based coupling agent are preferably used. Particularly, the silane-based coupling agent (silane coupling agent) is preferably used.

For the silane coupling agent (C), well-known ones can be used and there is no particular limitation, but specifically vinyltriethoxysilane, vinyltrimethoxysilane, vinyltris(β-methoxyethoxysilane), γ-glycidoxypropyltripropyltrimethoxysilane, γ-aminopropyltriethoxysilane, γ-methacryloxypropyltrimethoxysilane, or the like can be used.

The silane coupling agent (C) is blended in the amount of usually 0.1 to 5 parts by weight, and preferably 0.1 to 3 parts by weight, based on total 100 parts by weight of the polypropylene (i), propylene.ethylene-based copolymer (ii) and ethylene.α-olefin copolymer (B). When the blending amount of the coupling agent is within the above range, the silane coupling agent (C) is preferably used, because it doesn't give bad effect on the film transparency and flexibility and sufficiently improves the adhesion property.

Radical Initiator

The coupling agent typified by a silane coupling agent enables to exhibit a much stronger adhesivity with glass by a graft reaction with at least one of the polypropylene (i), the propylene.ethylene-based copolymer (ii) and the ethylene.α-olefin copolymer (B) by using a radical initiator. The radical initiator preferably employed in the invention is not particularly limited in its kind, and may be any initiators that can graft at least one of (i), (ii), and (B) with the coupling agent. Of these, organic peroxide is particularly preferably used as the radical initiator. In this case, the organic peroxide is used in the amount of about 0 to 5 parts by weight, based on total 100 parts by weight of the polypropylene (i), propylene.ethylene-based copolymer (ii), and ethylene.α-olefin copolymer (B).

For the organic peroxide, well-known ones can be appropriately used and there is no particular limitation, but preferred specific examples include dilauroyl peroxide, 1,1,3,3-tetramethylbutylperoxy-2-ethylhexanoate, dibenzoyl peroxide, t-amylperoxy-2-ethylhexanoate, t-butylperoxy-2-ethylhexanoate, t-butylperoxyl isobutyrate, t-butylperoxymaleic acid, 1,1-di(t-amylperoxy)-3,3,5-trimethylcyclohexane, 1,1-di(t-amylperoxyl)cyclohexane, t-amylperoxy isononanoate, t-amylperoxy n-octoate, 1,1-di(t-butylperoxy)-3,3,5-trimethylcyclohexane, 1,1-di(t-butylperoxy)cyclohexane, t-butylperoxy isopropyl carbonate, t-butylperoxy-2-ethylhexyl carbonate, 2,5-dimethyl-2,5-di(benzoylperoxy) hexane, t-amylperoxybenzoate, t-butylperoxy acetate, t-butylperoxy isononanoate, t-butylperoxybenzoate, 2,2-di(butylperoxy)butane, n-butyl-4,4-di(t-butylperoxy)butyrate, methyl ethyl ketone peroxide, ethyl-3,3-di(t-butylperoxy)butyrate, dicumyl peroxide, t-butylcumyl peroxide, di-t-butyl peroxide, 1,1,3,3-tetramethylbutyl hydroperoxide, acetylacetone peroxide, and the like.

Weathering Stabilizer

The solar battery sealing material of the invention and the polymer composition constituting the same may further contain various weathering stabilizers. The blending amount of the weathering stabilizer is preferably from 0 to 5 parts by weight, based on total 100 parts by weight of the polypropylene (i), propylene.ethylene-based copolymer (ii), and ethylene.α-olefin copolymer (B). When the weathering stabilizer is blended in 5 parts by weight or less, the weathering stability of the polymer composition is sufficiently obtained and deterioration of transparency and adhesion to glass of the solar battery sealing material and the polymer composition constituting the same is efficiently prevented.

As for the weathering stabilizer, there may be used one or two or more kinds of compound(s) selected from ultraviolet absorber, light stabilizer, antioxidant, and the like.

Specific examples of the ultraviolet absorber include benzophenone derivatives such as 2-hydroxy-4-methoxybenzophenone, 2,2-dihydroxy-4-methoxybenzophenone, 2-hydroxy-4-methoxy-4-carboxy benzophenone and 2-hydroxy-4-N-octoxybenzophenone, benzotriazole derivatives such as 2-(2-hydroxy-3,5-di-t-butylphenyl)benzotriazole, and 2-(2-hydroxy-5-methylphenyl)benzotriazole, and salicylate ester derivatives such as phenyl salicylate, and p-octyl phenyl salicylate.

As for the light stabilizer, the hindered amine light stabilizer is preferably used. As for the antioxidant, hindered phenol-based or phosphorous-based antioxidant is used.

Petroleum Resin (D1), Terpene Resin (D2), and Hydrogenated Derivatives Thereof(D3)

The solar battery sealing material of the invention and the polymer composition constituting the same preferably further contain the petroleum resin (D1), the terpene resin (D2), and the hydrogenated derivatives thereof (D3) in the amount of 1 to 30 parts by weight in total, based on total 100 parts by weight of the polypropylene (i), propylene.ethylene-based copolymer (ii), and ethylene.α-olefin copolymer (B).

The petroleum resin (D1), the terpene resin (D2) and the hydrogenated derivatives thereof (D3) used in the invention have a weight average molecular weight of usually 500 to 10,000, preferably 500 to 7,000, and more preferably 500 to 5,000, and have a glass transition temperature (Tg) obtained from an endothermic curve by a differential scanning calorimeter (DSC) of 30 to 100° C., preferably 40 to 100° C., and more preferably 50 to 100° C.

The petroleum resin (D1), the terpene resin (D2), and the hydrogenated derivatives thereof (D3) preferably used in the invention have excellent heat resistance and color-changing resistance. Therefore, material which is excellent in transparency, scratch resistance, and stress relaxation can be obtained by adding them. In particular, the stress absorbing property in the solar battery sealing material of the invention and the polymer composition constituting the same is preferably improved and the solar battery element or the like can be more suitably protected.

Other Components

The solar battery sealing material of the invention and the polymer composition constituting the same may suitably contain other components besides the components mentioned above within the scope of not impairing the purpose of the invention. For example, besides the polypropylene (i), propylene.ethylene-based copolymer (ii), and ethylene.α-olefin copolymer (B), there may suitably contain various polyolefins, various resins other than the polyolefin and/or various rubbers, or one or two or more kinds of additives selected from plasticizer, filler, pigment, dye, antistatic agent, antibacterial agent, fungicide, fire retardant, and dispersing agent, but the examples are not limited thereto.

Polymer Composition

The polymer composition of the invention has an excellent balance of flexibility, heat resistance, stress-absorbing property, transparency and impact strength at low temperature, and can be improved in adhesivity, weathering resistance, scratch resistance and stress-absorbing property by blending. In addition, the polymer composition may be preferably used in the field of optic applications such as lens, a prism, an anti-reflection film, a wavelength-selective light reflection film, a wavelength-selective low reflection film, a transparent conductive substrate, a diffusion sheet, a light collecting sheet, a retardation film, an optical compensation film, a liquid crystal panel substrate, a reflector plate, a semi-transmissive reflector plate, a scattering plate, a scattering reflection electrode-mounted substrate, a transparent electrode-mounted substrate, a specular electrode-mounted substrate, anti-fogging film, or polarizing plate, or a protective layer or sealing materials thereof; information applications such as computer, communications apparatus, or information terminal, or a protective layer or sealing material for these parts; electronic application such as housing of the household electronics or a protective layer or sealing material for electronic parts; and masking material application for display.

Solar Battery Sealing Material

The solar battery sealing material of the invention contains the ethylene.α-olefin copolymer (B) within the range of 5 to 95 parts by weight, based on total 95 to 5 parts by weight of the polypropylene (i) and propylene.ethylene-based copolymer (ii) (the total of (i), (ii) and (B) is 100 parts by weight), and preferably contains the ethylene.α-olefin copolymer (B) within the range of 5 to 40 parts by weight, based on total 95 to 60 parts by weight of the polypropylene (i) and propylene.ethylene-based copolymer (ii) (the total of (i), (ii) and (B) is 100 parts by weight). When the blending amount of (i), (ii), and (B) is within the above range, the good moldability of the sheet is obtained, and the heat resistance, transparency, and flexibility of the sheet for sealing the solar battery obtained becomes excellent, thus is preferable. When the total amount of the polypropylene (i) and propylene.ethylene-based copolymer (ii) is 95 wt % or less, good flexibility of the composition is obtained, and when the total amount of the polypropylene (i) and propylene.ethylene copolymer (ii) is 5 wt % or more, decrease in strength is preferably prevented. Within the above range, the blending ratio may be arbitrarily changed according to the type of usage and required properties.

Since the solar battery sealing material of the invention contains the ethylene.α-olefin copolymer (B) in the amount described above, it is excellent in the impact strength at low temperature. Therefore, the solar battery sealing material becomes easy in handling when being used or kept in the form of a sheet, film, or the like. In addition, it is expected to improve yield of the product which employs the materials. Moreover, the solar battery sealing material of the invention contains the ethylene.α-olefin copolymer (B) in the amount described above, thus excellent flexibility is obtained and the solar battery device can be suitably protected. Thus it is preferable. A method of preparing the solar battery sealing material of the invention may employ a known method, but a method of melt-blending with the use of a kneader, a roll, a Banbury mixer, an extruder or the like for the preparation is preferable.

The solar battery sealing material of the invention desirably has a maximum value of the loss tangent of 0.1 or more. When the maximum value of the loss tangent is 0.1 or more, excellent flexibility is obtained and the solar battery device is hardly damaged. Thus it is preferable. The loss tangent from 0.1 to 3 is preferable, much preferable is from 0.2 to 2.

Sheet for Sealing Solar Battery

The sheet for sealing the solar battery obtained by employing the solar battery sealing material of the invention is one of the preferred embodiments of the invention. This sheet for sealing solar battery has at least one layer formed of the solar battery sealing material of the invention. The term "formed of" as referred to herein means both cases where the entire corresponding layer is formed from the solar battery sealing material of the invention, and where a part of the corresponding layer is formed from the solar battery sealing material of the invention.

The thickness of the layer formed of the solar battery sealing material of the invention is within the rage of usually 0.01 to 1 mm, and preferably 0.05 to 0.8 mm. With the thickness within such range, breakages of the glass and solar battery cell during a laminating process can be prevented, and sufficient light transmittance preferably enables high photovoltaic generation to be obtained.

A method of forming the layer constituted by the solar battery sealing material of the invention is not particularly limited, but there may be employed various known molding methods (cast molding, extrusion molding, inflation molding, injection molding, compression molding, calendar molding or the like). In addition, the surface can be subjected to an embossing treatment, and blocking between the sealing sheets or between the sealing sheet and the other sheet can be prevented by decorating the surface of the layer with the embossing treatment. Further, since the emboss serves as a cushion for the solar battery device during the lamination, damages can be prevented. Thus is preferable.

For the layer formed of the solar battery sealing material of the invention, it is desirable that the internal Haze as measured using a specimen having the 0.5 mm or less thickness is within the range of 1 to 60%, preferably 1 to 40%.

For the layer formed of the solar battery sealing material of the invention, it is desirable that the light transmittance (trans) is 75% or more, preferably 80% or more when the layer has 0.5 mm thickness. With the light transmittance within such range, decrease in efficiency of the power generation can be reduced so that the layer can be suitably used in the invention. For the measurement of the light transmittance, a sample having a desired thickness, which is obtained by applying pressure under heating at 160° C. or above while being protected with a release film such as PET having a smooth surface, so as to eliminate the effect caused by asperities on the film surface and then by cooling, is subjected to the measurement after the film such as PET is removed.

The sheet for sealing the solar battery of the preferred embodiment of the invention preferably has at least one layer formed of the solar battery sealing material of the invention. Therefore, the number of layers formed of the solar battery sealing material of the invention may be one, or two or more. From the viewpoint of reducing costs with the simple constitution and from the viewpoint of efficiently using the light by significantly decreasing interfacial reflection between layers, the sheet having one layer is preferable.

The solar battery sealing sheet which is a preferred embodiment of the invention may only have a layer formed of the solar battery sealing material of the invention, or may have the other layers (hereinafter, referred as "the other layers") other than the layer formed of the solar battery sealing material of the invention.

Examples of the other layers include a hard coating layer, an adhesion layer, an anti-reflection layer, a gas barrier layer, an antifouling layer or the like for protecting the front or the back surface, which are classified according to the purpose. When classified according to materials, there may be provided with a layer formed of an ultraviolet curable resin, a layer formed of a thermosetting resin, a layer formed of a polyolefin resin, a layer formed of a carboxylic acid-modified polyolefin resin, a layer formed of a fluorine-containing resin, a layer formed of a cyclic olefin (co)polymer, a layer formed of an inorganic compound, or the like.

The positional relation between the layer formed of the solar battery sealing material of the invention and the other layers is not particularly limited, and a desired layer constitution is selected according to the purpose of the invention. That is, the other layers may be provided between two or more layers formed of the solar battery sealing material of the invention, may be provided on the outermost layer of the solar battery sealing sheet, or may be provided on the other positions. The other layers may be provided on only one side of the layers formed of the solar battery sealing material, or may be provided on both sides. The number of the other layers is not particularly limited, and an arbitrary number of the other layers may be provided, or the other layers may not be provided.

From the viewpoint of reducing costs with the simple layer constitution and from the viewpoint of efficiently using the light by significantly decreasing interfacial reflection between layers, the sheet for sealing the solar battery may be prepared only with the layers formed of the solar battery sealing material of the invention without providing the other layers. Alternatively, when other layers which are necessary or useful according to the purpose are required, such other layers may be appropriately provided.

When there is provided the other layers, the method of laminating the layer formed of the solar battery sealing material of the invention with the other layers is not particularly limited. However, a method of obtaining a laminate by co-extruding using a known melt extruder such as a cast molder, extrusion sheet molder, inflation molder, injection molder or the like, and a method of obtaining a laminate by melting or thermally laminating a layer on the other previously molded layer are preferable. In addition, lamination can be conducted by a dry laminate method or heat laminate method using suitable adhesive agents (for example, an acrylic adhesion agent such as maleic anhydride-modified polyolefin resins (e.g., Admer produced by Mitsui Chemicals Inc or Modic produced by Mitsubishi Chemical Corporation), low (non)-crystalline flexible polymer such as unsaturated polyolefin, ethylene/acrylic acid ester/maleic acid anhydride ternary copolymer (e.g., Bondine produced by Sumika CDF Chemical Co., Ltd); an ethylene/vinyl acetate copolymer; adhesive resin compositions including the same and the like). The adhesion agent having a heat resistance of approximately 120 to 150° C. is preferably used, and particularly preferably exemplified by a polyester-based or polyurethane-based adhesion agent. In order to improve adhesivity between both layers, for example, a silane-based coupling treatment, a titanium-based treatment, a corona treatment, a plasma treatment, or the like may be used.

For the sheet for sealing the solar battery of the invention, it is desirable that the internal Haze as measured using a specimen having the 0.5 mm or less in thickness is within the range of 1% to 60%, preferably 5% to 50%.

Solar Battery Module

The solar battery sealing material of the invention and the sheet for sealing the solar battery of the preferred embodiment of the invention have excellent properties mentioned above. Therefore, a solar battery module obtained by employing such the solar battery sealing material and/or the sheet for sealing the solar battery can utilize the effect of the invention and is one of the preferred embodiments of the invention.

In general, the solar battery module has a constitution in which a solar battery cell formed from multicrystalline silicon or the like is superposed and laminated between solar battery sealing materials, and both the front and back surfaces of the laminate is covered with a protective sheet. That is, a typical solar battery module has a configuration of a protective sheet for solar battery module (front surface protecting sheet)/a sheet for sealing a solar battery/a solar battery cell/a sheet for sealing a solar battery/a protective sheet for solar battery module (back surface protecting sheet). The solar battery module of a preferred embodiment of the invention is not limited to the above configuration, and a part of the layers described above may be suitably omitted or a layer other than the above layers may be suitably provided within the scope of not impairing the purpose of the invention. Typically, an adhesion layer, impact absorbing layer, a coating layer, an anti-reflection layer, a back surface reflecting layer, light diffusion layer or the like may be provided, but is not limited thereto. There is not particular limitation on the position for these layers to be provided, but considered with the purpose of providing such layers and characteristics of such layers, these layers may be provided on a suitable position.

Front Surface Protecting Sheet for Solar Battery Module

A front surface protecting sheet for the solar battery module preferably used for the solar battery module of the preferred embodiment of the invention is not particularly limited. However, since the protecting sheet is provided on the outermost layer of the solar battery module, it is preferable to have properties for obtaining a long-term reliability in the outdoor exposure of the solar battery module as well as weathering resistance, water repellency, contamination resistance, and mechanical strength. In addition, in order to efficiently utilize the solar light, being a sheet having low optical loss and high transparency is preferable.

Examples of the materials used for the surface protecting sheet for a solar battery module which is very useful in the solar battery module include resin films formed from a polyester resin, a fluorine resin, an acrylic resin, an ethylene-vinyl acetate copolymer, a cyclic olefin (co)polymer, or the like, glass substrates, and the like.

Preferred examples of the very useful resin films include a polyester, that is, particularly a polyethylene terephthalate, which is excellent from the points of transparency, strength, and cost.

In addition, the fluorine resin having particularly excellent weathering resistance is preferably used. Specific examples include an ethylene-tetrafluoroethylene copolymer (ETFE), a polyvinyl fluoride resin (PVF), a polyvinylidene-fluoride resin (PVDF), a polytetrafluoroethylene (TFE), an ethylene tetrafluoride-propylene hexafluoride copolymer (FEP), and polychlorotrifluoroethylene resin (CTFE).

The polyvinylidene fluoride resin is preferable from the viewpoint of weathering resistance, and the ethylene tetrafluoroethylene copolymer is preferable from the viewpoint of simultaneous pursuit of the weathering resistance and mechanical strength. In order to improve the adhesivity with materials constituting other layers such as sealing material layers, it is desirable to carry out a corona treatment or a plasma treatment onto the surface protecting sheet. In addition, a sheet, such as a biaxially stretched polypropylene sheet to which a stretching treatment is conducted in order to improve the mechanical strength, can be used.

When a glass is used as the surface protecting sheet for solar battery module, a total light transmittance of light having a wavelength of 350 to 1400 mm is preferably 80% or more, and more preferably 90% or more. As for the glass substrate, a white sheet glass which is small in absorption in the infrared region is generally used, but a blue sheet glass having the thickness of 3 mm or less hardly gives an effect on the output characteristic of the solar battery module. In order to increase the mechanical strength of the glass substrate, a tempered glass to which thermal treatment is conducted can be used or a float plate glass to which thermal treatment is not conducted can be used. Furthermore, in order to prevent the reflection, anti-reflection coating may be applied on a light receiving side of the glass substrate.

Back Surface Protecting Sheet for Solar Battery Module

The back surface protecting sheet for a solar battery module which is used for the solar battery module of the preferred embodiment of the invention is not particularly limited. However, since the back surface protecting sheet is positioned on the outermost layer of the solar battery module, it is required to have properties such as weathering resistance and mechanical strength as similar to the above mentioned surface protecting sheet. Therefore, the back surface protecting sheet for solar battery module may be constituted by the same materials as the surface protecting sheet. That is, aforementioned various materials useful for the surface protecting sheet also can be also used for the back surface protecting sheet. Particularly, the polyester resin and glass are preferably used.

In addition, since the back surface protecting sheet is not based on assuming the sunlight passing, the transparency required for the surface protecting sheet is not necessarily required. Therefore, in order to increase the mechanical strength of the solar battery module, or to prevent distortion and warpage due to a temperature change, an additional cleat may be provided. For example, a steel plate, a plastic plate, a FRP (glass fiber reinforced plastic) plate, or the like can be preferably used.

Solar Battery Device

For the solar battery module of the preferred example of the invention, the solar battery device is not particularly limited as long as it can generate electricity by using photovoltaic effect of a semiconductor. For example, a silicon (single crystalline, polycrystalline, or noncrystalline (amorphous)) solar battery, a compound semiconductor (group III to V, group II to VI, or the like) solar battery, wet solar battery, organic semiconductor solar battery or the like can be used. Among these, the polycrystalline solar battery is preferable from the viewpoint of a balance between the power generation property and cost.

Both the silicon and the compound semiconductor exhibit excellent properties as the solar battery device, but those are known by being easy to be damaged by external stress, impact or the like. Since the solar battery sealing material of the invention is excellent in flexibility, the sealing material absorbs the stress and the impact given to the solar battery device. Thus, high effect for preventing breakages on the solar battery device is achieved. Therefore, in the solar battery module of the preferred embodiment of the invention, it is desirable that the layer formed of the solar battery sealing material of the invention is directly in contact with the solar battery device.

Furthermore, when the solar battery sealing material has thermoplasticity, the solar battery device can be relatively readily taken out from the module after the solar battery module is produced once, and also has an excellent recyclability. Since the essential components of the solar battery sealing material of the invention have thermoplasticity, the thermoplasticity can be easily given to the entire solar battery sealing material. Thus, it is preferable from the viewpoint of recyclability.

Power Generating Unit

The solar battery module which is the preferred embodiment of the invention is excellent in productivity, power generation efficiency, longevity and the like. Accordingly, since the power generating unit employing such solar battery module is excellent in cost, productivity, power generation efficiency, longevity and the like, it is highly valuable in practical.

The power generating unit is suitable for the prolonged use for both the outside and inside such as for setting on the roof of a house, for a mobile power supply for outdoor use such as camping and for an auxiliary power of an automobile battery.

EXAMPLES

Hereinafter, the present invention will be described in more detail with reference to Examples, but the invention is not limited by the Examples in any meanings.

(Measuring Method)

In Examples and Comparative Examples, the measurements for the properties were carried out in the following manner.

Composition

The $^{13}$C-NMR measurement, as a steady way, was performed, and the composition of the polymer was calculated from the result of the measurement.

Melting Point (DSC Curve)

An endotherm curve of DSC was determined, and the temperature at the maximum peak position was taken as Tm.

The measurement was conducted and determined from an endotherm curve obtained when a sample was filled in an aluminum pan and was heated to 200° C. at a rate of 100° C./min, kept at 200° C. for 10 minutes, then cooled at a rate of 10° C./min to −150° C., and subsequently heated at a rate of 10° C./min.

Density

The strand after MFR measurement at 190° C. under a load of 2.16 kg was gradually cooled back to the room temperature over 1 hour, and then measurement was carried out according to the density gradient tube method.

Transparency (Internal Haze)

The transparency (internal Haze) was measured with a digital turbidimeter "NDH-20 D" manufactured by Nippon Denshoku Industries Co., Ltd., using a 1 mm-thick specimen soaked in benzyl alcohol filled in a predetermined cell.

Flexibility

The flexibility was measured according to JIS K6301, using a JIS No. 3 dumbbell, at a span interval of 30 mm and a tensile test speed of 30 mm/min at 23° C.

Heat Resistance (TMA)

The needle penetration temperature (° C.) was determined from a TMA curve in accordance with JIS K7196 using a specimen having a thickness of 1 mm, at a heating rate of 5° C./min, by applying a pressure of 2 kg/cm$^2$ onto a flat surface indenter with 1.8 mmφ.

Loss Tangent (tan δ)

The loss tangent (tan δ) was measured from −100° C. to 100° C. using RSD-II manufactured by Rheometric Science at a temperature increase rate of 2° C./min and at 10 rad/s under the conditions of a torsion mode (torsion) of a width of 10 mm and a length of 38 mm.

Impact-Resistant Strength at Low Temperature

The press sheet having a thickness of 3 mm was prepared at a press temperature of 200° C., and the izod impact strength (IZ) measurement was carried out in accordance with ASTM D256.

Neck-In Evaluation

A sheet having a thickness of 0.5 mm was molded using a T-dice having a width of 250 mm.

Neck-in (mm)=250 mm−the film width (mm)

(Material Used)

In the following examples and a comparative example, the kinds, the producing methods, the properties of the resins used for the preparation of sample, were as follows.

(i-1) Polypropylene

Isotactic polypropylene F327D manufactured by Prime Polymer (MFR=7 g/10 min, Tm=139° C., propylene content=95.2% by mole, mmmm fraction=96.5%) was used.

(ii-1) Propylene.Ethylene Copolymer

The propylene.ethylene copolymer was obtained as described below, and the propylene.ethylene-butene copolymer having the following properties was used.

To a 2000 ml polymerization apparatus thoroughly purged with nitrogen, 917 ml of dry hexane, 85 g of 1-butene, and triisobutylaluminum (1.0 mmol) were charged at normal temperature, then the temperature inside the polymerization apparatus was elevated to 65° C., and the polymerization apparatus was pressurized with propylene to 0.77 MPa and subsequently pressurized with ethylene to 0.78 MPa. Thereafter, a toluene solution, in which 0.002 mmol of dimethylmethylene(3-tert-butyl-5-methylcyclopentadienyl)fluorenylzirconium dichloride and methylaluminoxane (manufactured by Tosoh Finechem Corp.) in terms of 0.6 mmol of aluminum were contacted, was added to the polymerization vessel, and polymerization was conducted for 20 minutes with the internal temperature at 65° C. and the total pressure at 0.78 MPa maintained by continuously supplying ethylene. The polymerization was stopped by adding 20 ml of methanol. After depressurizing, a polymer was precipitated out of the polymerization solution in 2 L of methanol, and was dried in a vacuum at 130° C. for 12 hours.

The amount of the obtained polymer was 60.4 g. The polymer had an intrinsic viscosity [η] of 1.81 dl/g, a glass transition temperature of −27° C., an ethylene content of 13 mol %, a butene content of 19 mol %, mm fraction of 92.7%, and a molecular weight distribution (Mw/Mn) of 2.4 measured by GPC. In addition, for the heat of fusion measured by DSC measurement, a clear peak of fusion was not observed.

(ii-2) Propylene.Ethylene-Based Copolymer

To a stainless steel reactor having a volume of about 4 liters, 2.5 liters of purified toluene was charged under a nitrogen atmosphere. After nitrogen supply was stopped, ethylene was supplied at a rate of 0.15 L/hr, propylene was supplied at a rate of 3 L/hr, hydrogen (0° C., 1 atmosphere) was supplied at a rate of 0.26 L/min, and toluene was supplied at a rate of 13 L/hr.

Thereto, while temperature was being raised to 80° C., 1.5 ml of a heptane solution (0.0002 mM/ml) of hafnium pyridylamine catalyst and 3 ml of a toluene solution (0.0002 mM/ml) of ammoniumtetra(pentafluorophenyl)tallowalkylborate methylbis hydride were added, and 1 ml of 0.01 mmol/ml toluene solution of PMAO was added in such a way that the amount in terms of aluminum atom reaches 0.01 mmol. The mixture was kept at 80° C. for 1 hour to carry out copolymerization of propylene and ethylene. During the reaction, propylene, ethylene, hydrogen and toluene were continuously supplied to the reactor in the aforementioned rate to maintain the total pressure at 4 MPa. The polymerization was stopped by adding isobutyl alcohol. The reactor inside was purged with nitrogen, then the solution in the reactor was poured into 20 liters of methanol to precipitate out the polymer. After the precipitate was separated from the solution by filtration, it was dried under reduced pressure to obtain 4.6 g of propylene.ethylene copolymer. The propylene ethylene copolymer has an intrinsic viscosity [η] of 2.2 dl/g measured in decalin at 135° C., a glass transition temperature of −27° C., an ethylene content of 16 mol %, mm fraction of 93.2%, and a molecular weight distribution of 2.6 measured by GPC. In addition, the DSC measured, the polymer had the maximum peak temperature of the melting point at 52° C., and the broad melting point from 40° C. to 120° C., and the heat of fusion ΔH of 20 J/g.

(B-1) Ethylene.α-olefin Copolymer

Ethylene.butene copolymer (density=0.885 g/cm³, an ethylene content of 88 mol %, a butene content of 12 mol %, and MFR=4 g/10 min) produced by Mitsui Chemicals Inc. was used.

(C-1) Silane Coupling Agent

γ-methacryloxypropyltrimethoxysilane (KBM503, produced by Shin-Etsu Chemical Co., Ltd) was used.

(D3-1) Hydrogenated Terpene Resin

Hydrogenated terpene resin (produced by Yasuhara Chemical Co., Ltd, P125, Tg=68° C., average molecular weight of 1100) was used.

Example 1

From the product obtained by blending 15 parts by weight of the polypropylene (i-1), 60 parts by weight of the propylene.ethylene copolymer (ii-1), and 25 parts by weight of the ethylene.α-olefin copolymer (B-1), a sheet having the thickness of 0.5 mm was prepared using a sheet molding machine at 200° C.

The properties of the obtained sheet are presented in table 1.

Example 2

From the blended product containing 10 parts by weight of the hydrogenated terpene resin (D3-1), to total amount of 100 parts by weight of 15 parts by weight of the polypropylene (i-1), 60 parts by weight of the propylene.ethylene copolymer (ii-1), and 25 parts by weight of the ethylene.α-olefin copolymer (B-1), a sheet having the thickness of 0.5 mm was prepared using a sheet molding machine at 200° C.

The properties of the obtained sheet are presented in table 1.

Example 3

From the blended product containing 0.5 parts by weight of the γ-methacryloxypropyltrimethoxysilane (C-1), to total amount of 100 parts by weight of 15 parts by weight of the polypropylene (i-1), 60 parts by weight of the propylene.ethylene copolymer (ii-1), and 25 parts by weight of the ethylene.α-olefin copolymer (B-1), a sheet having the thickness of 0.5 mm was prepared using a sheet molding machine at 200° C.

The properties of the obtained sheet are presented in table 1.

Example 4

From the product obtained by blending 15 parts by weight of the isotactic polypropylene (i-1), 60 parts by weight of the propylene.ethylene copolymer (ii-1), and 25 parts by weight of the ethylene.α-olefin copolymer (B-1), a sheet having the thickness of 0.5 mm was prepared using a sheet molding machine at 200° C.

The properties of the obtained sheet are presented in table 1.

Comparative Example 1

From the product obtained by blending 20 parts by weight of the isotactic polypropylene (i-1) and 80 parts by weight of the propylene.ethylene copolymer (ii-1), a sheet having the thickness of 0.5 mm was prepared using a sheet molding machine at 200° C.

The properties of the obtained sheet are presented in table 1.

TABLE 1

|  | Example 1 | Example 2 | Example 3 | Example 4 | Compative Example 1 |
|---|---|---|---|---|---|
| Flexibility (YM) (MPa) | 22 | 18 | 20 | 27 | 24 |
| Heat resistance (TMA) (° C.) | 136 | 134 | 135 | 115 | 138 |

TABLE 1-continued

| | Example 1 | Example 2 | Example 3 | Example 4 | Compative Example 1 |
|---|---|---|---|---|---|
| Transparency (Internal Haze) (%) | 16 | 14 | 18 | 18 | 9 |
| Maximum Peak of Tan δ | 0.7 | 0.8 | 0.7 | 0.6 | 0.8 |
| Low temperature impact strength (IZ: −30° C.) (J/m) | 450 | 280 | 420 | 490 | 80 |
| Neck-in evaluation (mm) | 60 | 50 | 80 | 60 | 110 |

The invention claimed is:

1. A solar battery sealing material comprising 1 to 30 parts by weight of polypropylene (i) which has the content of a structural unit derived from propylene of more than 90 mol %; and 70 to 99 parts by weight of a propylene-ethylene-based copolymer (ii) which has a structural unit derived from propylene of 45 to 90 mol %, a structural unit derived from ethylene of 10 to 25 mol %, and a structural unit derived from α-olefin having 4 to 20 carbon atoms of 0 to 30 mol % (total amount of (i) and (ii) is 100 parts by weight), wherein the solar battery sealing material further comprises an ethylene-α-olefin copolymer (B) having the molecular distribution (Mw/Mn) of 3 or less within the amount of 5 to 40 parts by weight, based on 95 to 60 parts by weight of the total amount of (i) and (ii) (total amount of (i), (ii), and (B) is 100 parts by weight), wherein the ethylene-α-olefin copolymer (B) has a structural unit derived from ethylene of 80 to 90 mol %.

2. The solar battery sealing material according to claim 1, wherein the propylene-ethylene-based copolymer (ii) has no melting point Tm (° C.) on an endothermic curve measured by a differential scanning calorimeter (DSC), or the propylene-ethylene-based copolymer (ii) has a Tm and a heat of fusion ΔH of 30 J/g or less and satisfies the relation of $\Delta H(J/g) < 345 \times Ln$ (propylene content (mol %)) $-1492$ when the propylene content is within a range of $76 \leq$ propylene content (mol %) $\leq 90$.

3. The solar battery sealing material according to claim 1, wherein the propylene-ethylene-based copolymer (ii) has a structural unit derived from 1-butene and/or a structural unit derived from 1-octene as a structural unit (a) derived from α-olefin having 4 to 20 carbon atoms.

4. The solar battery sealing material according to claim 1, wherein the ethylene-α-olefin copolymer (B) has a density of 0.86 to 0.89 g/cm$^3$.

5. The solar battery sealing material according to claim 1, further comprising a silane coupling agent (C).

6. The solar battery sealing material according to claim 1, further comprising a petroleum resin (D1), a terpene resin (D2), and hydrogenated derivatives thereof (D3); or the hydrogenated derivatives thereof (D3) within the amount of 1 to 30 parts by weight, based on 100 parts by weight of the total amount of the polypropylene (i), propylene-ethylene-based copolymer (ii), and ethylene-α-olefin copolymer (B).

7. A power generation unit obtained by using the solar battery module obtained by using the solar battery sealing material of claim 1.

8. The solar battery sealing material according to claim 1, further comprising a radical initiator.

* * * * *

UNITED STATES PATENT AND TRADEMARK OFFICE
CERTIFICATE OF CORRECTION

PATENT NO. : 8,525,017 B2  
APPLICATION NO. : 12/085511  
DATED : September 3, 2013  
INVENTOR(S) : Mori et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 365 days.

Signed and Sealed this  
Third Day of March, 2015

Michelle K. Lee  
*Deputy Director of the United States Patent and Trademark Office*